(12) United States Patent
Rosenberg et al.

(10) Patent No.: US 7,069,165 B2
(45) Date of Patent: Jun. 27, 2006

(54) METHOD AND ARRANGEMENT FOR SIGNAL LOOP TEST

(75) Inventors: Jonas Gustafsson Rosenberg, Stockholm (SE); Fredrik Lindqvist, Älvsjö (SE); Adam Wiå, Haninge (SE); Antoni Fertner, Stockholm (SE); Axel Frank Jensen, Fredensborg (DK); Per Ola Börjesson, Lund (SE); Per Ödling, Hägersten (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 123 days.

(21) Appl. No.: 10/840,820

(22) Filed: May 7, 2004

(65) Prior Publication Data

US 2005/0027456 A1 Feb. 3, 2005

Related U.S. Application Data

(63) Continuation of application No. PCT/SE04/00296, filed on Mar. 4, 2004.

(60) Provisional application No. 60/469,658, filed on May 12, 2003.

(51) Int. Cl.
*G01D 18/00* (2006.01)
*G01D 3/00* (2006.01)
*G01R 15/00* (2006.01)

(52) U.S. Cl. .................. 702/85; 702/57; 702/109; 324/601; 324/637

(58) Field of Classification Search ................. 702/85, 702/109, 106, 57, 65; 324/637, 601, 642, 324/532–535, 527
See application file for complete search history.

(56) References Cited

U.S. PATENT DOCUMENTS 6,538,451 B1 3/2003 Galli et al.
2003/0231023 A1* 12/2003 Belge et al. ............... 324/637

FOREIGN PATENT DOCUMENTS

WO WO 0124482 A1 4/2001

OTHER PUBLICATIONS

Stefano Galli, et al: IEEE Journal on Selected Areas in Communications vol. 20, No. 5, Jun. 2002 Loop Makeup Identification Via Single Ended Testing: Beyond Mere Loop Qualification Inspec No: 7303048 abstract.

* cited by examiner

*Primary Examiner*—Bryan Bui
*Assistant Examiner*—Meagan S Walling

(57) ABSTRACT

The invention refers to single-ended test of a loop with the aid of a transceiver, wherein an input impedance $(Z_{in}(f))$ of the loop is generated. The transceiver has a digital part, a codec and an analog part and is connected to the loop. With the aid of a transmitted and a reflected broadband signal ($v_{in}$, $v_{out}$) an echo transfer function $H_{echo}(f)=V(f)_{out}/V_{in}(f)$ is generated, which also can be expressed as $$H_{echo}(f) = \frac{H_\infty(f)Z_{in}(f) + Z_{h0}(f)}{Z_{in}(f) + Z_{hyb}(f)}.$$

Here $Z_{h0}(f)$, $Z_{hyb}(f)$ and $H_\infty(f)$ are model values for the transceiver. In a calibration process a test transceiver, with the same type of hardware as the transceiver, is connected to known impedances, replacing the loop. $H_{echo}(f)=V(f)_{out}/V_{in}(f)$ is generated for the known impedances and the model values are generated and are stored in a memory in the transceiver. The stored model values are then used when the input impedance $(Z_{in}(f))$ for the loop is generated after a measurement of the broadband signal $(V_{in}, v_{out})$ is performed.

12 Claims, 4 Drawing Sheets

METHOD AND ARRANGEMENT FOR SIGNAL LOOP TEST

CROSS-REFERENCE TO RELATED APPLICATIONS

This application a non-provisional under 35 U.S.C. 119(e) of U.S. provisional application No. 60/469,658 filed on May 12, 2003 and is also a continuation under 35 U.S.C. 120 of PCT International Application number PCT/SE2004/000296 filed on Mar. 4, 2004, the disclosures of which is incorporated herein by reference.

TECHNICAL FIELD OF THE INVENTION

The present invention relates to a method and an arrangement in the area of single-ended test of a signal line.

DESCRIPTION OF RELATED ART

In today's telecommunication it is essential from an economical point of view to use existing copper wires for broadband transmission. These copper wires, often called twisted-pair copper loops or copper access lines, have among themselves very different properties from a broadband point of view. Telecom operators therefore have a great interest in testing the properties of the lines to be able to fully utilize their transmission capacity. The abovementioned is discussed in an article by Walter Goralski: "xDSL Loop Qualification and Testing", IEEE Communications Magazine, May 1999, pages 79–83. The article also discusses testing possibilities and test equipment.

The transmission properties of copper lines are more closely discussed in an article by José E. Schutt-Ainé: "High-Frequency Characterization of Twisted-Pair Cables", IEEE Transactions on Communications, Vol. 49, No. 4, April 2001. Propagation parameters of high bit rate digital subscriber twisted-pair cables are extracted by a wave propagation method model. The frequency dependence in the properties of the transmission line and the influence of the skin effect on these are studied.

Testing the transmission properties of a line can be performed by sending a test signal from one end of the line and measure it at the other end, so called double end test. That method is labour intensive and expensive. A more frequently used method is to send a test signal from one end of the line and measure on the reflected pulse, so called Single-Ended Loop Testing, SELT. In an article by Stefano Galli and David L Waring: "Loop Makeup Identification Via Single Ended Testing: Beyond Mere Loop Qualification", IEEE Journal on Selected Areas in Communications, Vol. 20, No. 5, June 2002 is discussed the influence of different types of line discontinuities and generated echoes in connection with single-ended testing. A mathematical method for handling the echoes is presented and also an experimental validation of the method.

In single-ended testing it is advantageous to use the transceiver as a part of a measurement device for the loop under test. The broadband communication transceiver is no perfect voltage generator but introduces distortion in the measurement. How to remove this distortion is discussed in a standardization paper by Thierry Pollet: "How is G.selt to specify $S_{11}$ (calibrated measurements)?", ITU Telecommunication Standardization Sector, Temporary Document OJ-091; Osaka, Japan 21–25 Oct., 2002. A calibration method is presented, based on a one port scattering parameter $S_{11}$, that includes transceiver parameters which are generated during a calibration. Also in a standardization paper by Thierry Pollet: "Minimal information to be passed between measurement and interpretation unit", ITU Telecommunication Standardization Sector, Temporary Document OC-049; Ottawa, Canada 5–9 Aug., 2002, the one port scattering parameter $S_{11}$ is discussed.

SUMMARY OF THE INVENTION

The present invention is concerned with a problem how to compensate for influence of a transceiver on a single-ended testing of a copper access line.

Another problem is how to generate and store transceiver values for the compensation.

A further problem is to generate a reliable input impedance of the access line.

The problems are solved by calibrating a test transceiver, which is a typical broadband communication transceiver, and generate transceiver model values. These values are stored and are used in a transmitter for communication purposes, which is connected to a loop. A test signal, as reflected by the loop, is measured at the communication transceiver, giving a loop test result. The influence on this result by the communication transceiver itself is compensated for with the aid of the stored transceiver model values.

Somewhat more in detail the problems are solved in the following manner. At least three test impedances each with a known value are connected to the test transceiver. Test signals are sent through the transceiver and the test impedance and the reflected transceiver test signals are measured. The transceiver model values for the test transceiver itself are generated and are stored. A loop test with a real, unknown line is performed with the communication transceiver and is compensated for with the aid of the stored transceiver model values.

A purpose with the present invention is to compensate for influence of a transceiver on a single-ended testing of a copper access line.

Another purpose is to generate and store transceiver values for the compensation.

A further purpose is to generate a reliable input impedance of the access line.

An advantage with the invention is that the influence of a transceiver on a single-ended testing of a copper access line can be compensated for.

Another advantage is that transceiver values for the compensation can be generated and stored and can be applied for all standard broadband transceivers, based on the same hardware as the tested one. Hence a costly procedure of calibrating an actual transceiver will be eliminated.

Still an advantage is that the generated transceiver values have an easily understandable meaning.

A further advantage is that a reliable input impedance of the access line can be generated.

Still another advantage is that the test transceiver can be any one of the transceivers used for communication purposes.

The invention will now be more closely described with the aid of embodiments and with reference to the enclosed drawings.

DETAILED DESCRIPTION OF EMBODIMENTS

Figure 1:
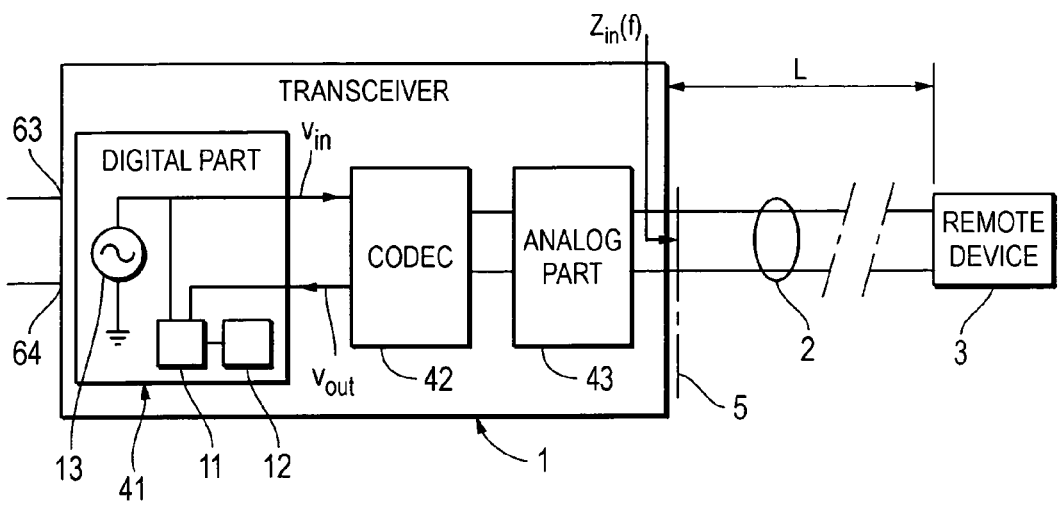
FIG. 1 shows a simple block schematic over a transceiver and a transmission line.

FIG. 1 shows a simple block schematic over a transceiver 1 at a central office, connected to a remote device 3 at a customer's premises via a digital subscriber line 2 (DSL). The transceiver includes a digital part 41, a codec 42 and an analog part 43, the so called Analog Front End AFE. The digital part includes in turn a digital signal generator 13 and a computational device 11 interconnected with a memory device 12. The transceiver 1 also has an input 63 and an output 64. The generator, which is connected to the computational device 11, sends a broadband input loop test signal $v_{in}$ to the remote device 3 via the codec 42, the analog part 43 and the line 2. A reflected broadband loop test signal $v_{out}$ is received in the computational device from the line 2 via the analog part and the codec. The line 2 is a conventional copper line of a length L, which has certain properties, such as signal attenuation in different frequency ranges.

As mentioned above it is essential for a network operator to be able to utilize the already existing copper line 2 for the broadband transmission. The operator therefore must know the line properties, such as the length L, signal attenuation and transmission capacity. These properties must normally be determined after a measurement, which is advantageously performed from the transceiver end of the line as a so called Single-Ended Loop Test, SELT. The parameters are related to a line input impedance $Z_{in}(f)$ which can be evaluated using transmitted and reflected test signals. The broadband loop test signal $V_{in}$, sent for such measuring purposes, is reflected back over the line 2 and is noted as the loop test signal $v_{out}$. As will be described below, the signals $v_{in}$ and $v_{out}$ are used in the determining of the properties of the line 2.

What the operator in fact needs to know is the input impedance $Z_{in}(f)$ of the line 2 including the remote device 3, measured from a transceiver interface 5 and being independent of the transceiver 1 itself. A first step in getting the required line properties is to generate an echo transfer function $H_{echo}(f)$ for the actual line 2. This is calculated by performing a frequency translation of the broadband signals $v_{in}$ and $v_{out}$, resulting in signals $v_{in}(f)$ and $v_{out}(f)$ in the frequency domain. The transfer function is generated by the relationship $$H_{echo}(f) = V_{out}(f)/V_{in}(f) \quad (1)$$

in which the frequency is denoted by f.

Naturally, the function $H_{echo}(f)$ includes properties of the transceiver 1. Below it will be described by an example how the required line properties of the line 2 can be obtained with the aid of the frequency dependent echo transfer function $H_{echo}(f)$. First, the transceiver analog part 43 will be described somewhat more in detail in connection with FIG. 2. This is to throw light upon the difficulties in characterizing the transceiver 1 in a simple manner.

Figure 2:
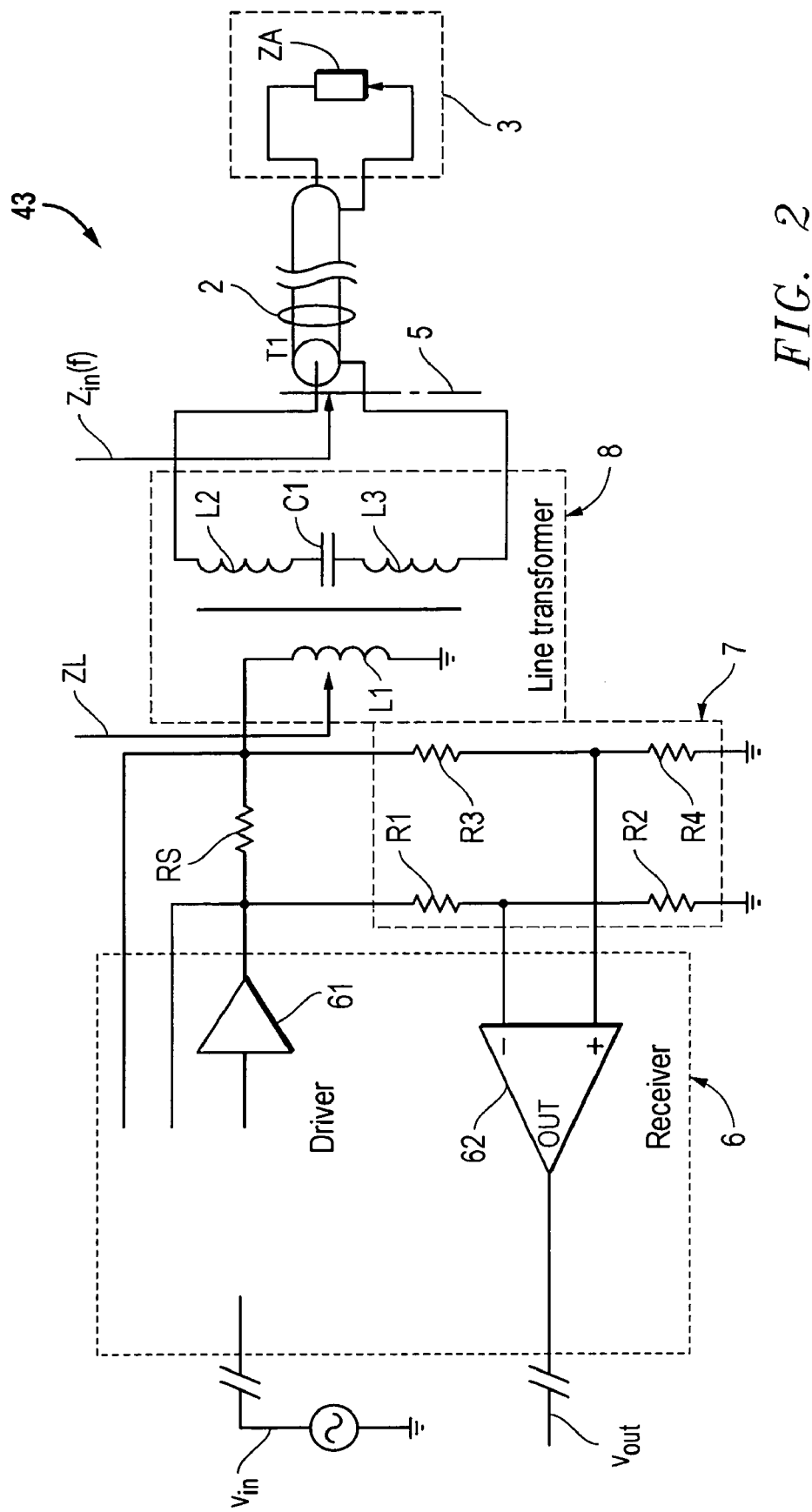
FIG. 2 shows a somewhat more detailed block diagram over a part of the transceiver and the line.

FIG. 2 is a simplified block diagram over the analog transceiver part 43 and the line 2 of FIG. 1, yet somewhat more detailed than in that figure. The analog part 43 includes an amplifier block 6, a hybrid block 7, a sense resistor RS and a line transformer 8. The amplifier block 6 has a driver 61 with its input connected to the digital generator 13 via the codec 42, not shown. I also has a receiver 62 receiving signals from the line 2 and having its output connected to the transceiver digital part 41, not shown. The driver output is connected to the sense resistor RS, the terminales of which are connected to the hybrid block 7. The latter has four resistors R1, R2, R3 and R4 and is connected to inputs of the receiver 62. The line transformer 8 has a primary winding L1 and two secondary windings L2 and L3 interconnected by a capacitor C1. The primary winding L1 is connected to the sense resistor RS and the secondary windings L2 and L3 are connected to the line 2. The frequency dependent line input impedance at the interface 5 is denoted $Z_{in}(f)$ and the input impedance at the primary side of the transformer is denoted ZL. The termination of the far-end of the line 2, the remote device 3, is represented by an impedance ZA.

The signal $V_{in}$, now in analog form from the codec 42, is amplified in the driver block 61. The output impedance of the driver is synthesized by the feedback loop from the sense resistor RS. The line transformer 8 has a voltage step-up from the driver to the loop. The capacitor C1 has a DC-blocking function. The transformer and the capacitor act as a high pass filter between the driver 61/receiver 62 and the loop 2, 3 with a cut-off frequency around 30 kHz. No galvanic access to the loop is possible in this case.

In the present description a frequency-domain model of the echo transfer function $H_{echo}(f)$ is used to calculate the frequency dependent input impedance $Z_{in}(f)$ of the loop 2 and 3, as seen by the transceiver 1 at the interface 5. The input impedance can then be used for calculating several loop qualification parameters. This frequency-domain model of the echo transfer function $H_{echo}(f)$ includes three parameters $Z_{h0}(f)$, $Z_{hyb}(f)$ and $H_\infty(f)$ which relate to the transceiver 1. The parameters, transceiver model values, fully describe the transceiver from this point of view.

The parameters $Z_{h0}(f)$, $Z_{hyb}(f)$ and $H_\infty(f)$ are originally deduced analytically from the circuits of the transceiver. Some minor simplifications have been made in the analysis, but the model has proved to be very accurate. In the enclosed Appendix 1, "Simulation of the echo transfer function for DAFE708" it is shown how the model of the echo transfer function $H_{echo}(f)$ is derived.

The values of the parameters are normally not calculated directly from the component values of the transceiver, but are generated from measurements in a calibration process, as will be described below.

In the earlier mentioned standardization paper "How is G.selt to specify $S_{11}$ (calibrated measurements)?" the scattering parameter $S_{11}$ is expressed with three parameters C1, C2 and C3 for the transceiver. These parameters should not be confused with the transceiver model values $Z_{h0}(f)$, $Z_{hyb}(f)$ and $H_\infty(f)$ of the present description. The parameters C1, C2 and C3 are dimensionless quantities and are not given any concrete meaning, although they are successfully used to model the transceiver. The transceiver model values of the present description are recognized in the analysis and can be interpreted directly:

The value $H_\infty(f)$ is the frequency dependent echo transfer function for the transceiver 1 with open connection to the line 2, i.e. when the line impedance is of unlimited magnitude.

The value $Z_{hyb}(f)$ is the transceiver impedance as measured at the connections to the line 2, i.e. the transceiver impedance at the interface 5 as seen from the line side.

The value $Z_{h0}(f)$ can be expressed as $Z_{h0}(f) = H_0(f) \cdot Z_{hyb}(f)$, in which the value $H_0(f)$ is the frequency dependent echo transfer function for the transceiver 1 with the connections to the line 2 shortcut and the value $Z_{hyb}(f)$ is defined above.

It is to observe that the transceiver model values are not measured directly, but are generated in a process as will be described below.

The echo transfer function $H_{echo}(f)$ of equation (1) can be expressed as:

$$H_{echo}(f) = \frac{H_\infty(f)Z_{in}(f) + Z_{h0}(f)}{Z_{in}(f) + Z_{hyb}(f)} \quad (2)$$

in which $Z_{in}(f)$ is the earlier mentioned input impedance of the line 2 as a function of the frequency f; and $Z_{h0}(f)$, $Z_{hyb}(f)$ and $H_\infty(f)$ are complex vectors and are the transceiver model values mentioned above.

After a calibration measurement of a certain transceiver version its vectors can be determined. These vectors, the transceiver model values, are then pre-stored in for example the software of the transceivers of the measured version, e.g. in the memory 12 of the transceiver 1. The model values are then used for the loop test of the line 2 with its initially unknown properties.

Figure 3:
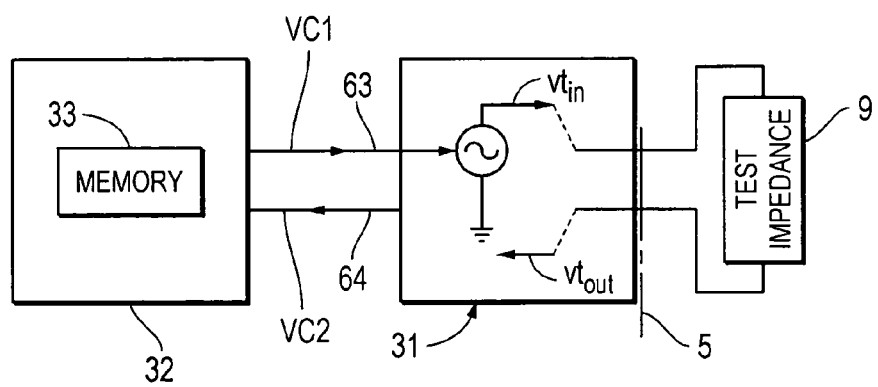
FIG. 3 shows a block schematic over the transceiver connected to an impedance of known value.

In connection with FIG. 3 will be mentioned how the calibration measurement is performed. The figure shows a test transceiver 31, to which test impedances 9 of different predetermined values are connected at the interface 5 for the line 2. A measurement device 32 with a memory 33 is connected to the input 63 and the output 64 of the test transceiver. The measurement device 32 sends a control signal VC1 to the test transceiver 31 and initiates it to generate a broadband transceiver test signal $vt_{in}$, one for each value of the test impedance 9. A reflected output transceiver test signal $vt_{out}$ is received in the test transceiver, which sends a corresponding control signal VC2 to the measurement device. A complete measurement requires the measurement of three selected impedance values. The echo transfer function $H_{echo}(f)$ is then generated in accordance with the relationship (1).

Using three impedance values for the calibration is sufficient to generate the transceiver values. To get more precise values, more than the three impedances can be used. This gives rise to an overdetermined equation system. An example on a set of standard values of the test impedance 9 for the calibration is an open circuit, a shortcut circuit and an impedance value corresponding to an expected value for the loop, e.g. 100 ohms. It should be noted that a value for a purely resistive component is normally valid only up to a limited frequency, e.g. 1 MHz. For higher frequencies it is recommended to measure the impedance value of the "resistive" component.

The generating of the three complex vectors $Z_{h0}(f)$, $Z_{hyb}(f)$ and $H_\infty(f)$ for the measured transceiver 31 is performed in the following manner. The model of the echo transfer function in the relationship (2) can be expressed as:

$$(1 - H_{echo}(f) Z_{in}(f)) \begin{pmatrix} Z_{h0}(f) \\ Z_{hyb}(f) \\ H_\infty(f) \end{pmatrix} = H_{echo}(f)Z_{in}(f) \quad (3)$$

or equivalently Ax=b, where $$A = (1 - H_{echo}(f) Z_{in}(f)), \quad x = \begin{pmatrix} Z_{h0}(f) \\ Z_{hyb}(f) \\ H_\infty(f) \end{pmatrix} \text{ and } b = H_{echo}(f)Z_{in}(f)$$

The general solution to the system Ax=b is $$x = (A^T A)^{-1} A^T b$$

By using the values of the transfer function $H_{echo}(f)$, measured as described above with different types of the input terminations 9, the vector x can be solved. The thus generated calibration values of the vector x are stored for example in the memory 33 of the measurement device 32 or in the memory 12 of the transceivers of the measured version. Note that A, x and b normally are complex valued and frequency dependent.

After a measurement of the echo transfer function $H_{echo}(f)$ for the actual unknown line 2, its input impedance as seen by the transceiver 1 at the interface 5 can be generated as:

$$Z_{in}(f) = \frac{Z_{h0}(f) - Z_{hyb}(f)H_{echo}(f)}{H_{echo}(f) - H_\infty(f)} \quad (4)$$

To summarize, a certain hardware for transceivers like the transceiver 1 is first calibrated. This is performed for the test transceiver 31 with the aid of the impedances 9 and the transceiver test signals $vt_{in}$ and $vt_{out}$. The vector x is calculated and the values of the vector x are stored and can be used for any transceiver with the same hardware. The echo transfer function $H_{echo}(f)$ is then measured by the transceiver 1 for the line 2 having unknown properties with the aid of the loop test signals $v_{in}$ and $v_{out}$. The frequency dependent input impedance $Z_{in}(f)$ of the line 2, as seen from the transceiver interface 5, is then generated.

In the embodiment described above, both the transceiver test signals $vt_{in}, vt_{out}$ and the loop test signals $v_{in}, v_{out}$ have been broadband signals. It is possible to use signals of any desired frequency width both for the calibration and the measurement of the line. The calibration and the loop test will of course be valid only for the selected frequency range. It has been mentioned that the transceiver model values are stored in the memory 12 of the transceiver 1. An obvious alternative is to store the values in the memory 33 or in a memory in some central computer and transmit them to the transceiver 1 when they are required for the generating of e.g. the input impedance $Z_{in}(f)$ of the line 2. Also, in the description has been mentioned the test transceiver 31 and the transceiver 1 for communication purposes. The test transceiver 31 can be any of a set of transceivers which are based on one and the same hardware. The test transceiver can in an obvious way be used for the communication purposes.

The above generating of transceiver model values and the generating of the impedance value for the line 2 will be shortly described in connection with flowcharts in FIGS. 4 and 5.

Figure 4:
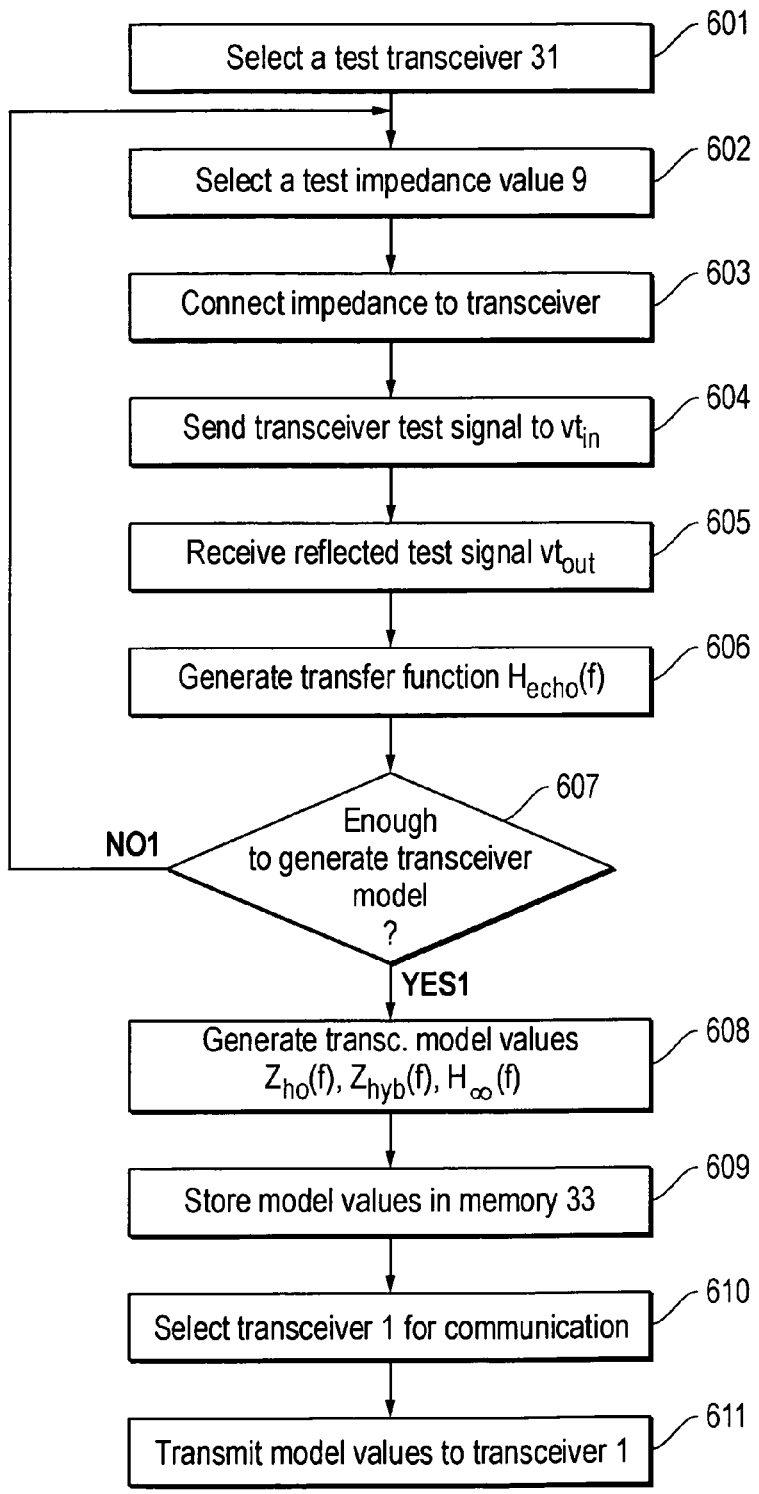
FIG. 4 shows a flow chart for generating of transceiver characteristic values.

In FIG. 4 is shown the generating and storing of the transceiver model values. The method begins in a step 601 with the selection of the transceiver 31 for test purposes. In a step 602 an impedance 9 with a predetermined value is selected and in a step 603 the impedance is connected to the line connection of the test transceiver 31. In a step 604 the transceiver test signal $vt_{in}$ is sent through the transceiver 31 to the line 2. To get transceiver model values that can be used for a wide range of applications the test signal is a broadband signal. The signal is reflected by the remote device 3 and after passage of the transceiver 31 it is received as the transceiver test signal $vt_{out}$ in a step 605. In a step 606 the echo transfer function $H_{echo}(f)$ is generated in the computational device 32 for the actual impedance 9, after first having transformed the signals $vt_{in}$ and $vt_{out}$ into the frequency domain. In a step 607 it is investigated whether measurements for a sufficient number of the impedances 9 have been made, so that the transceiver model values $Z_{h0}(f)$, $Z_{hyb}(f)$ and $H_\infty(f)$ can be generated. In an alternative NO1 a further impedance 9 is selected in the step 602. For an alternative YES1 the transceiver model values $Z_{h0}(f)$, $Z_{hyb}(f)$ and $H_\infty(f)$ are generated in a step 608. In a step 609 the vector x, i.e. the transceiver model values, are stored in the memory 33. Next, the transceiver 1 for communication purposes is selected in a step 610. In a step 611 the transceiver model values $Z_{h0}(f)$, $Z_{hyb}(f)$ and $H_\infty(f)$ are transmitted to the selected transceiver 1 and are stored in the memory 12.

Figure 5:
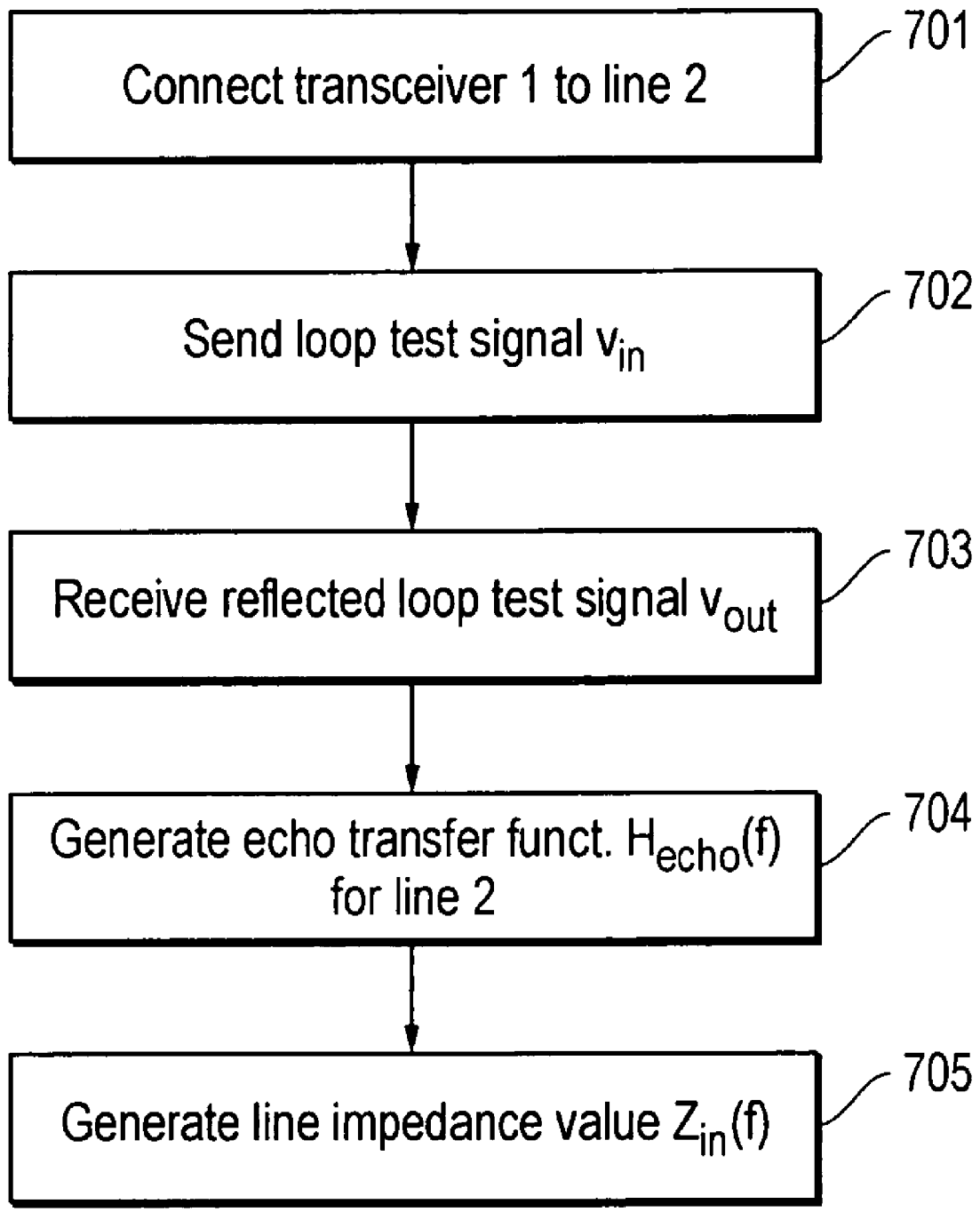
FIG. 5 shows a flow chart for generating of an impedance value for the line.

FIG. 5 shows the generating of the frequency dependent line input impedance $Z_{in}(f)$ at the transceiver interface 5 to the line 2. In a step 701 the transceiver 1 for communication purposes is connected to the line 2 with the remote device 3. The loop test signal $v_{in}$ is sent in a step 702. The loop test signal $v_{out}$ as reflected by the line 2 is received by the transceiver and is measured in a step 703. In a step 704 the frequency dependent echo transfer function $H_{echo}(f)$ is generated in the computational device 11. The frequency dependent impedance value $Z_{in}(f)$ for the line 2 is generated in the device 11 with the aid of the stored transceiver model values and the echo transfer function, step 705. This generating is performed in accordance with the relationship (4).

The invention claimed is:

1. A Method in single-ended test of a signal line, the method comprising the steps of:

Selecting a test transceiver;

Connecting impedances each of a predetermined value to a line connection of the test transceiver;

generating, in a calibration process, calibration values for the test transceiver with the aid of said impedances and test signals ($vt_{in}$, $vt_{out}$), generating for the test transceiver frequency dependent echo transfer functions ($H_{echo}(f)$) utilizing at least three impedances;

generating test transceiver model values ($Z_{h0}(f)$, $Z_{hyb}(f)$, $H_\infty(f)$) with the aid of said echo transfer functions ($H_{echo}(f)$) and the corresponding impedance values, said model values including an echo transfer function ($H_\infty(f)$) for the test transceiver with open line connection, a test transceiver impedance value ($Z_{hyb}(f)$) as seen from the line side and a product ($Z_{h0}(f)$) of said transceiver impedance value ($Z_{hyb}(f)$) and an echo transfer function ($H_0(f)$) for the test transceiver with shortcut line connection;

selecting a transceiver for communication purposes of the same type of hardware as said test transceiver; and storing the transceiver model values ($Z_{h0}(f)$, $Z_{hyb}(f)$, $H_\infty(f)$) in said transceiver for communication purposes.

2. The method according to claim 1 comprising the steps of storing the test transceiver model values ($Z_{h0}(f)$, $Z_{hyb}(f)$, $H_\infty(f)$) for performing the calibration process.

3. The method according to claim 2 comprising the steps of:

connecting a loop, including the signal line and a remote device to the transceiver for communication purposes;

sending, via the connected transceiver, a loop test signal ($v_{in}$) to the line;

measuring, via said transceiver for communication purposes, the loop test signal ($v_{out}$) as reflected;

generating an echo transfer function ($H_{echo}(f)$) for the loop;

generating an impedance value ($Z_{in}(f)$) for the line and the remote device with the aid of the stored test transceiver model values ($Z_{h0}(f)$, $Z_{hyb}(f)$, $H_\infty(f)$) and the generated echo transfer function ($H_{echo}(f)$).

4. The method according to claim 3, wherein the test of the loop is a frequency broadband test.

5. An arrangement in single-ended test of a signal line, the arrangement comprising:

A first transceiver;

impedances of each a predetermined value to be connected to a line connection of the first transceiver;

a measurement device for generating, in a calibration process, calibration values for the first transceiver with the aid of said impedances and test signals ($vt_{in}$, $vt_{out}$), the measurement device being arranged to generate a frequency dependent echo transfer function ($H_{echo}(f)$), for the first transceiver utilizing at least three of said impedances;

the measurement device being further arranged to generate first transceiver model values ($Z_{h0}(f)$), ($Z_{hyb}(f)$, $H_\infty(f)$) with the aid of said echo transfer function ($H_{echo}(f)$) and the corresponding impedance values, said model values including an echo transfer function ($H_\infty(f)$) for the first transceiver with open line connection, a first transceiver impedance value ($Z_{hyb}(f)$) as seen from the line side and a product of said first transceiver impedance value ($Z_{hyb}(f)$) and an echo transfer function ($H_0(f)$) for the first transceiver with shortcut line connection;

a second transceiver, for communication purposes, of the same type of hardware as said first transceiver; wherein said second transceiver for communication purposes has a memory for storing the first transceiver model values ($Z_{h0}(f)$, $Z_{hyb}(f)$, $H_\infty(f)$).

6. The arrangement according to claim 5, wherein the measurement device has a memory for storing the first transceiver model values ($Z_{h0}(f)$, $Z_{hyb}(f)$, $H_\infty(f)$).

7. The arrangement according to claim 5, wherein said second transceiver further comprises:

a loop, including the line and a remote device, connected to the transceiver line connection of the second transceiver;

a computational device;

a device for sending a loop test signal ($v_{in}$) to the line via the second transceiver and measuring a corresponding reflected signal ($v_{out}$) via the second transceiver, the computational device being arranged both to generate an echo transfer function ($H_{echo}(f)$) for the loop and to generate an impedance value ($Z_{in}(f)$) for the line with the remote device with the aid of the stored first transceiver model values ($Z_{h0}(f)$, $Z_{hyb}(f)$, $H_\infty(f)$).

8. The arrangement according to claim 7, wherein the device for sending the loop test signal ($v_{in}$) is arranged to send frequency broadband signals.

9. An arrangement in single-ended test of a signal line, the arrangement comprising:
 means for selecting a test transceiver;
 means for connecting impedances of each a predetermined value to a line connection of the test transceiver;
 means for generating, in a calibration process, calibration values for the test transceiver with the aid of said impedances and test signals ($vt_{in}$, $vt_{out}$),
 means for generating for the test transceiver frequency dependent echo transfer functions ($H_{echo}(f)$) utilizing at least three impedances; and
 means for generating test transceiver model values ($Z_{h0}(f)$, $Z_{hyb}(f)$, $H_\infty(f)$) with the aid of said echo transfer functions ($H_{echo}(f)$) and the corresponding impedance values, said model values including an echo transfer function ($H_\infty(f)$) for the test transceiver with open line connection, a test transceiver impedance value ($Z_{hyb}(f)$) as seen from the line side and a product ($Z_{h0}(f)$) of said test transceiver impedance value ($Z_{hyb}(f)$) and an echo transfer function ($H_0(f)$) for the test transceiver with shortcut line connection;
 means for selecting a transceiver for communication purposes of the same type of hardware as said test transceiver; and
 means for storing the test transceiver model values ($Z_{h0}(f)$, $Z_{hyb}(f)$, $H_\infty(f)$) in said transceiver for communication purposes.

10. The arrangement according to claim 9 further comprising means for storing the test transceiver model values ($Z_{h0}(f)$, $Z_{hyb}(f)$, $H_\infty(f)$) for performing the calibration process.

11. The arrangement according to claim 9 further comprising:
 means for connecting a loop, including the signal line and a remote device to the transceiver for communication purposes;
 means for sending, via the connected transceiver for communication purposes, a loop test signal ($v_{in}$) to the line;
 means for measuring, via said transceiver for communication purposes, the loop test signal ($v_{out}$) as reflected;
 means for generating an echo transfer function ($H_{echo}(f)$) for the loop;
 means for generating an impedance value ($Z_{in}(f)$) for the line and the remote device with the aid of the stored test transceiver model values ($Z_{h0}(f)$, $Z_{hyb}(f)$, $H_\infty(f)$) and the generated echo transfer function ($H_{echo}(f)$).

12. The arrangement according to claim 11, wherein the test of the loop is a frequency broadband test.

* * * * *

UNITED STATES PATENT AND TRADEMARK OFFICE
CERTIFICATE OF CORRECTION

PATENT NO. : 7,069,165 B2
APPLICATION NO. : 10/840820
DATED : June 27, 2006
INVENTOR(S) : Rosenberg et al.

It is certified that error appears in the above-identified patent and that said Letters Patent is hereby corrected as shown below:

On the Title Page, item (75), under "Inventors", in Column 1, Line 7, delete "Hägersten" and insert -- Älvsjö --, therefor.

Signed and Sealed this

Eighth Day of April, 2008

JON W. DUDAS
*Director of the United States Patent and Trademark Office*